United States Patent [19]

Bach

[11] Patent Number: 5,592,104
[45] Date of Patent: Jan. 7, 1997

[54] OUTPUT BUFFER HAVING TRANSMISSION GATE AND ISOLATED SUPPLY TERMINALS

[75] Inventor: Randall Bach, Stillwater, Minn.

[73] Assignee: LSI Logic Corporation, Milpitas, Calif.

[21] Appl. No.: 571,724

[22] Filed: Dec. 13, 1995

[51] Int. Cl.⁶ .................................................. H03K 17/16
[52] U.S. Cl. ................... 326/27; 326/34; 326/57
[58] Field of Search .................... 326/4, 21, 27, 326/34, 57, 121

[56] References Cited

U.S. PATENT DOCUMENTS

| | | | |
|---|---|---|---|
| 4,961,010 | 10/1990 | Davis | 307/443 |
| 5,034,629 | 7/1991 | Kinugasa et al. | 326/121 X |
| 5,140,194 | 8/1992 | Okitaka | 326/121 X |
| 5,210,449 | 5/1993 | Nishino et al. | 307/473 |
| 5,281,869 | 1/1994 | Lundberg | 307/443 |
| 5,300,829 | 4/1994 | Lev et al. | 326/57 X |
| 5,355,028 | 10/1994 | O'Toole | 326/121 |
| 5,355,029 | 10/1994 | Houghton et al. | 307/443 |
| 5,436,577 | 7/1995 | Lee | 326/58 |

*Primary Examiner*—David R. Hudspeth
*Attorney, Agent, or Firm*—Westman, Champlin & Kelly, P.A.

[57] ABSTRACT

An output buffer having a data input terminal, a data output terminal, a predriver stage, an output stage and a resistive device. The predriver stage includes a first pull-up transistor and a first pull-down transistor which have control terminals coupled to the data input terminal and have first and second outputs, respectively. The output stage includes a second pull-up transistor and a second pull-down transistor which have control terminals coupled to the first and second outputs, respectively, and have third and fourth output terminals coupled to the data output terminal. The resistive device is coupled between the control terminals of the second pull-up and pull-down transistors.

6 Claims, 3 Drawing Sheets

OUTPUT BUFFER HAVING TRANSMISSION GATE AND ISOLATED SUPPLY TERMINALS

BACKGROUND OF THE INVENTION

The present invention relates to an output buffer and, more particularly, a tri-state semiconductor output buffer for an integrated circuit.

Tri-state output buffers are most commonly used at the outputs of semiconductor integrated circuits for driving data lines or busses. A tri-state output buffer allows the output to be driven to a logic high state, a logic low state or a high impedance state. Therefore, several devices can be coupled to the same data bus, with each device driving the bus at a different time. The output buffers of the non-driving devices are disabled and placed in the high impedance state such that the non-driving devices will not interfere with the output of the driving device.

Tri-state output buffers are also used for outputs which require impedance or delay compensation. Several buffers are connected together in parallel, with the number of enabled buffers being controlled to achieve a desired impedance or delay compensation in response to process, voltage or temperature variations.

Tri-state output buffers can be implemented with various technologies, such as complementary metal oxide semiconductor (CMOS) technology. A traditional CMOS tri-state output buffer has a predriver stage with a NAND gate and a NOR gate which drive a pull-up transistor and a pull-down transistor in an output driver stage. The pull-up and pull-down transistors switch between conducting and nonconducting states to pull the output to a logic high level or a logic low level as a function of an input signal.

A disadvantage of the traditional tri-state output buffer is that NAND and NOR gates have driving characteristics that are quite different from one another in CMOS technology. As a result, there may be a period of time when the output driver switches logic state that both the pull-up and pull-down transistors conduct current. A temporary current path forms from power to ground which causes a current "spike" in the output of the buffer. Current spikes are relatively difficult to control because of the different driving characteristics of the NAND and NOR gates.

In addition, a typical CMOS tri-state output buffer has very fast rise and fall characteristics which can cause reflection and ringing in unterminated transmission lines coupled to the output. "Slew-rate" buffers have been used to limit these transient currents in the output by slowing the rise and fall characteristics of the output. The buffers are typically modified by decreasing the widths of selected transistors in the predriver stage, rather than in the output driver stage, so that the characteristics of the output driver stage remain unchanged. However, decreasing the size of transistors to introduce a delay or reduce current spikes causes the rise and fall, or delay, characteristics of the output to change with respect to one another. This makes it difficult to achieve desired performance characteristics since an adjustment for one performance characteristic may adversely affect another performance characteristic.

Another disadvantage of the traditional tristate output buffer is that the input signal must connect to one terminal of the NAND and NOR gates creating a larger input capacitance. The buffer also requires more transistors which adversely increases the area consumed by the buffer on the integrated circuit, or if smaller transistor sizes are used for a given area, adversely decreases the drive capability and thus the propagation delay through the buffer.

SUMMARY OF THE INVENTION

The output buffer of the present invention includes a data input terminal, a data output terminal, a predriver stage, an output driver stage and a resistive device. The predriver stage includes a first pull-up transistor and a first pull-down transistor which have control terminals coupled to the data input terminal and have first and second outputs, respectively. The output driver stage includes a second pull-up transistor and a second pull-down transistor which have control terminals coupled to the first and second outputs, respectively, and have third and fourth output terminals coupled to the data output terminal. The resistive device is coupled between the control terminals of the second pull-up and pull-down transistors.

In one embodiment, the output buffer is configured as a tri-state output buffer and further includes an enable input terminal, an inverter, a third pull-up transistor, a third pull-down transistor and a CMOS transmission gate. The third pull-up transistor is coupled to the control terminal of the second pull-up transistor and has a control terminal coupled to the enable input terminal. The third pull-down transistor is coupled to the control terminal of the second pull-down transistor and has a control terminal coupled to the inverter. The inverter is coupled to the enable input terminal. The CMOS transmission gate forms the resistive device and is coupled between the control terminals of the second pull-up and pull-down transistors. The CMOS transmission gate has complementary control terminals, with one control terminal being coupled to the enable input terminal and the other control terminal being coupled to the inverter.

The CMOS transmission gate resistively couples and decouples the control terminals of the output driver transistors in cooperation with the third pull-up and pull-down transistors to enable and disable the output driver stage in response to enable signals applied to the enable input terminal. The CMOS transmission gate could be replaced with any voltage controlled resistive device.

DETAILED DESCRIPTION OF THE PREFERRED EMBODIMENTS

The present invention is an output buffer having a resistive device such as a CMOS transmission gate which eliminates current "spikes" in the output and provides a simple impedance and delay compensation. The buffer can be configured with or without a tri-state function.

Figure 1:
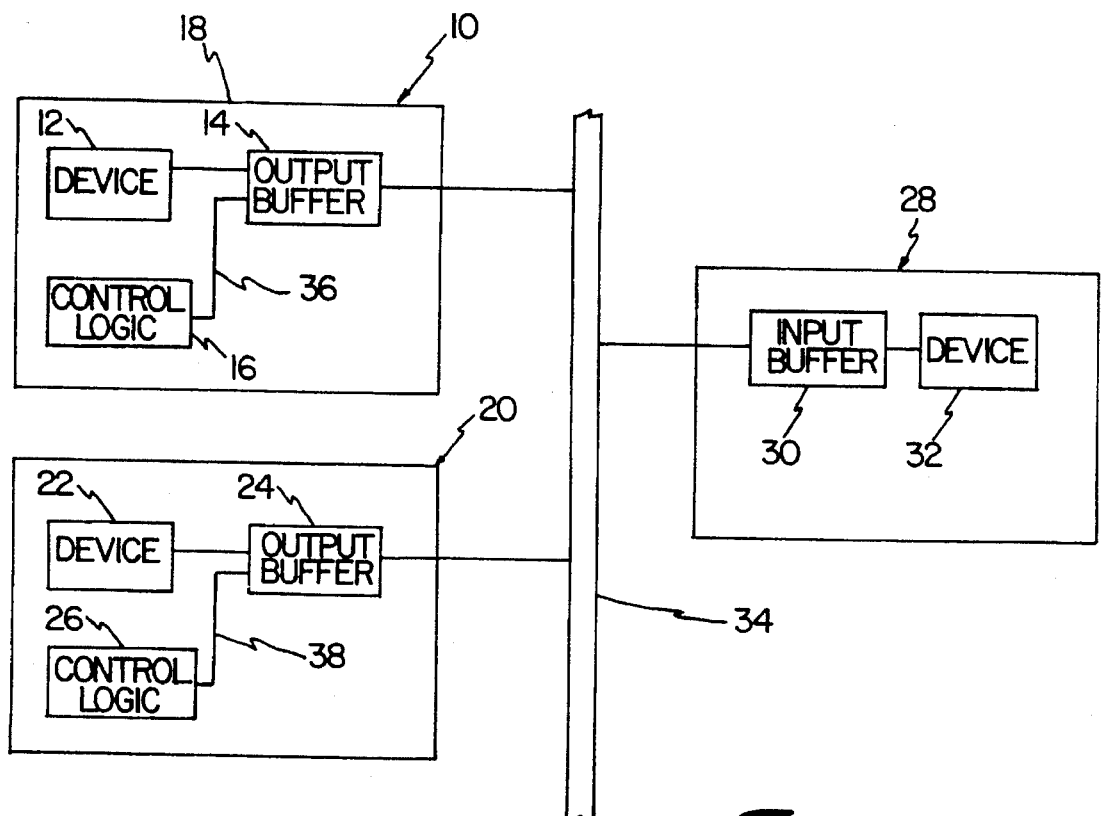
FIG. 1 is a schematic diagram of an advanced semiconductor integrated circuit having a tri-state output buffer coupled to a data bus in accordance with the present invention.

FIG. 1 is a schematic diagram of several advanced integrated circuits (ASICs) coupled over a data bus according to the present invention. ASIC 10 includes semiconductor device 12, tri-state output buffer 14 and control logic 16 which are enclosed in package 18. ASIC 20 includes semiconductor device 22, tri-state output buffer 24 and control logic 26. ASIC 28 includes input buffer 30 and semiconductor device 32. Semiconductor devices 12 and 22 are coupled to a data bus 34 through tri-state output buffers 14 and 24. Semiconductor device 32 is coupled to data bus 34 through input buffer 30.

Control logic 16 and 26 provide enable signals 36 and 38 to tri-state output buffers 14 and 24 which selectively enable and disable the buffers. For example, control logic 16 may enable buffer 14 while control logic 26 disables buffer 24. The output of disabled buffer 24 is driven to a high impedance state such that device 12 can drive device 32 without interference from device 22.

In the embodiment shown in FIG. 1, the tri-state output buffers of the present invention are used to buffer external outputs of ASICs 10 and 20. In an alternative embodiment, the tri-state output buffers are used to buffer outputs internal to the ASIC, such as when driving an internal data bus. Also, the tri-state output buffers can be implemented with separate components which are external to the ASIC.

Figure 2:
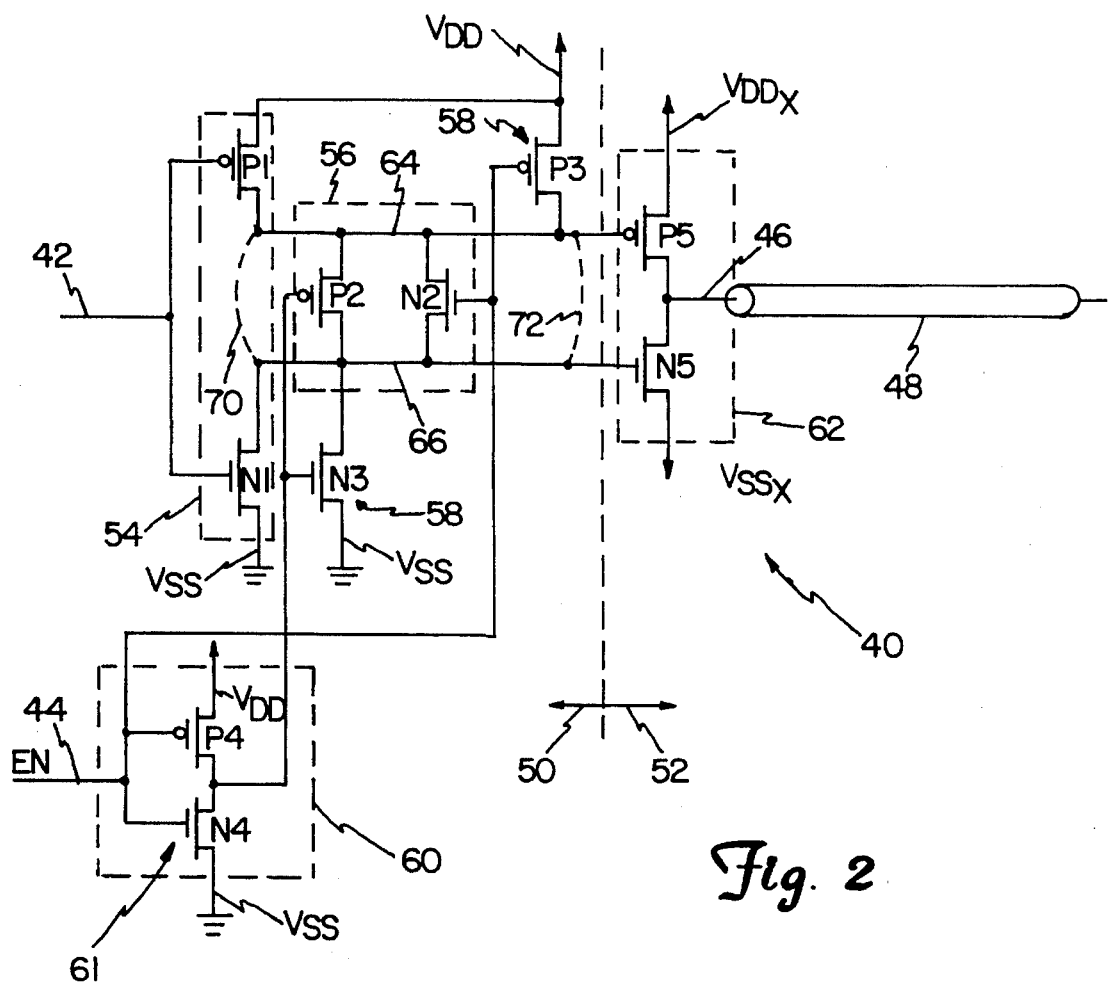
FIG. 2 is a schematic diagram of a CMOS tri-state output buffer in accordance with the present invention.

FIG. 2 is a schematic diagram of a CMOS tri-state output buffer in accordance with the present invention. Tri-state output buffer 40 includes a data input terminal 42, an enable input terminal 44 and a data output terminal 46. Data output terminal 46 is coupled to a transmission line 48, which may be coupled to one or more devices. Tri-state output buffer 40 further includes a predriver stage 50 and an output driver stage 52. Predriver stage 50 includes input stage 54, transmission gate 56, bias circuit 58 and enable control circuit 60. Output driver stage 52 includes output driver 62.

Input stage 54 includes p-channel pull-up transistor P1 and n-channel pull-down transistor N1. The gates or "control" terminals of transistors P1 and N1 are coupled to data input terminal 42. The source of transistor P1 is coupled to voltage supply terminal $V_{DD}$. The drain of transistor P1 is coupled to predriver output terminal 64. The drain of transistor N1 is coupled to predriver output terminal 66. The source of transistor N1 is coupled to ground terminal $V_{SS}$.

CMOS transmission gate 56 includes p-channel transistor P2 and n-channel transistor N2, which are coupled in parallel with one another between predriver output terminal 64 and predriver output terminal 66. The source of transistor P2 and the drain of transistor N2 are coupled to predriver output terminal 64. The drain of transistor P2 and the source of transistor N2 are coupled to predriver output terminal 66. The gates of transistors P2 and N2 are coupled to enable control circuit 60 and are controlled by complementary drive signals.

Bias circuit 58 includes p-channel transistor P3 and n-channel transistor N3. Transistor P3 is a pull-up transistor having its source coupled to voltage supply terminal $V_{DD}$ and its drain coupled to predriver output terminal 64. The gate of transistor P3 is coupled to enable control circuit 60. Transistor N3 is a pull-down transistor having its drain coupled to predriver output terminal 66, its source coupled to voltage supply terminal $V_{SS}$, and its gate coupled to enable control circuit 60.

Enable control circuit 60 includes an inverter 61 formed by p-channel pull-up transistor P4 and n-channel pull-down transistor N4. The gates of transistors P4 and N4 are coupled to enable input terminal 44 and to the gates of transistors N2 and P3. The source of transistor P4 is coupled to voltage supply terminal $V_{DD}$. The drain of transistor P4 is coupled to the drain of transistor N4 and to the gates of transistors P2 and N3. The source of transistor N4 is coupled to power supply terminal $V_{SS}$.

Output driver 62 includes p-channel pull-up transistor P5 and n-channel pull-down transistor N5. The gate of transistor P5 is coupled to predriver output terminal 64. The gate of transistor N5 is coupled to predriver output terminal 66. The source of transistor P5 is coupled to voltage supply terminal $V_{DDX}$. The drain of transistor P5 is coupled to the drain of transistor N5, data output terminal 46. The source of transistor N5 is coupled to voltage supply terminal $V_{SSX}$. In the embodiment shown in FIG. 2, the transistors in output driver stage 52 are coupled to different power supply terminals than the transistors in predriver stage 50. This isolates transient currents developed in output driver stage 52 from the power supply terminals used for predriver stage 50. However, the power supply terminals used in predriver circuit 50 can be the same as those used in output driver stage 52 in alternative embodiments.

In the normal, non-tri-state mode, enable signal EN on enable input terminal 44 is a logic high level which pulls the output of inverter 61 low. Pull-up transistor P3 and pull-down transistor N3 turn off while transmission gate transistors P2 and N2 turn on. Transmission gate transistors P2 and N2 effectively short predriver output terminals 64 and 66 together, as represented by dashed lines 70 and 72. With terminals 64 and 66 shorted, input stage 54 and output driver stage 62 behave as CMOS inverters, with the output of one inverter driving the input of the other inverter. The logic state on data output terminal 46 therefore follows the logic state applied to data input terminal 42.

When enable signal EN goes low, tri-state output buffer 40 enters a tri-state mode. The low logic level on enable input terminal 44 causes transmission gate transistors P2 and N2 to turn off which breaks the connection between predriver output terminals 64 and 66. Pull-up transistor P3 turns on pulling predriver output terminal 64 high, which turns off output driver transistor P5. Similarly, pull-down transistor N3 turns on pulling predriver output terminal 66 low, which turns off output driver transistor N5. With output driver transistors P5 and N5 off, data output terminal 46 becomes a high impedance connection.

Transmission gate 56 can be replaced with any voltage controlled resistive device coupled between predriver output terminal 64 and predriver output terminal 66 and having one or more control terminals controlled by an enable control circuit, such as circuit 60.

Figure 3:
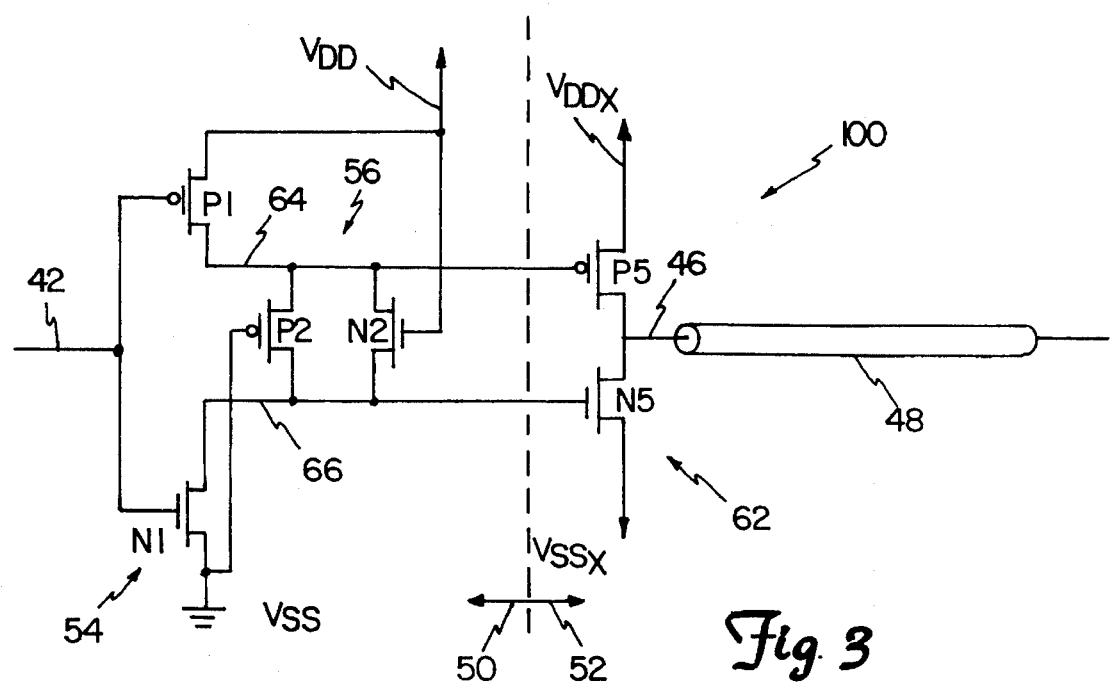
FIG. 3 is a schematic diagram of an output buffer without a tri-state function, in accordance with the present invention.

FIG. 3 is a schematic diagram of an alternative embodiment of the present invention which does not have a tri-state function. The same reference numerals are used in FIG. 3 as were used in FIG. 2 for common elements. In FIG. 3, the gates of transistors P2 and N2 are coupled to voltage supply terminals $V_{SS}$ and $V_{DD}$, respectively, as opposed to an enable control circuit as in FIG. 2. Transistors P2 and N2 are therefore on and resistively connect predriver output terminals 64 and 66 to one another such that input stage 54 and output driver stage 62 act as CMOS inverters with one inverter driving the other inverter. Transmission gate 56 can be replaced with any resistive device, such as a simple resistor, in alternative embodiments of the present invention. Also, the buffer of the present invention can be converted into an inverting buffer by placing an inverter at data input terminal 42.

In the embodiments shown in FIGS. 2 and 3, transmission gate 56 prevents output driver transistors P5 and N5 from turning on at the same time to prevent current "spikes" at data output terminal 46. When the output switches state, transmission gate 56 provides a built-in RC function which delays the output driver transistor that is turning on from the output driver transistor that is turning off.

For example, if data input terminal 42 is at a logic high level, output driver transistor P5 will be on and output driver transistor N5 will be off. As the logic level at data input terminal 42 goes from the logic high level to a logic low level, transistor P1 turns on and transistor N1 turns off. Transistor P1 pulls predriver output terminal 64 to a logic high level which turns off output driver transistor P5. At this point in time, both output driver transistors P5 and N5 are off. The resistive characteristics of transmission gate 56 delay predriver output terminal 66 from being pulled up, which delays output driver transistor N5 from turning on. Therefore, output driver transistor N5 turns on after output driver transistor P5 turns off. A similar action occurs when the input switches from a logic low level to a logic high level.

If there were no delay between the switching of transistors P5 and N5, there would be a time period during which both transistors would be conducting current, which would cause a current "spike" from power supply terminal $V_{DDX}$ to power supply terminal $V_{SSX}$. The "break-before-make" action of the present invention drastically reduces current spikes when the output on data output terminal 46 changes state. The current spike reduction can be significant in reducing noise in integrated circuits caused by simultaneous switching of several output buffers. There is also power reduction.

Transistors P2 and N2 can be sized to adjust the delay between the switching of transistors P5 and N5. Transistors P2 and N2 can also be sized to reduce ringing and other current transients in the output of the buffer. Current transients can be reduced by slowing the time rate-of-change of the output current (dI/dt), or "edge rate" at terminal 46. With the present invention, the sizes of transistors P2 and N2 can easily be increased to increase the RC delay and thus slow the rate-of-change of the output current without sacrificing matching between voltage rise and fall characteristics at data output terminal 46.

Figure 4:
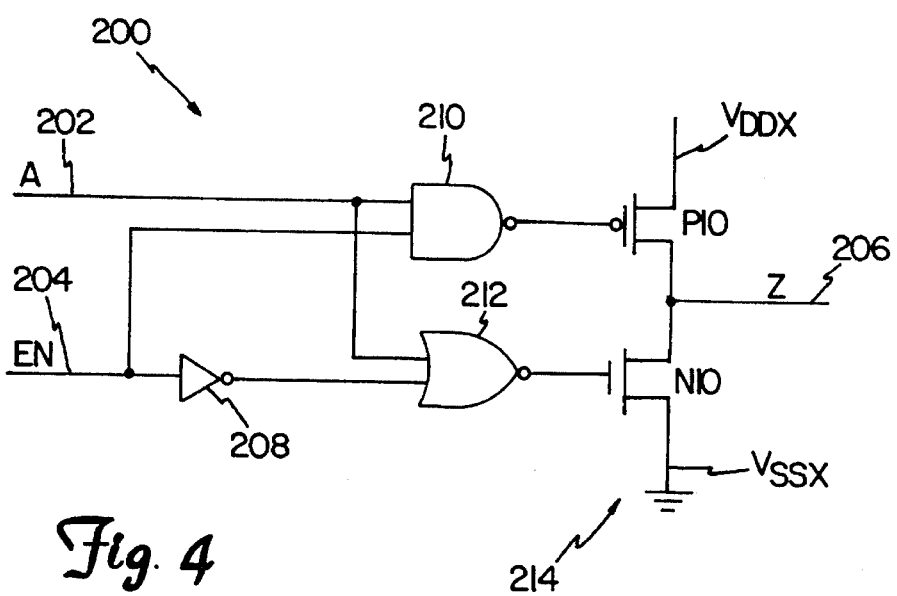
FIG. 4 is a schematic diagram of a traditional CMOS tri-state output buffer of the prior art.

FIG. 4 is a schematic diagram of a tri-state output buffer of the prior art. Tri-state output buffer 200 includes data input terminal 202, enable input terminal 204, data output terminal 206, inverter 208, NAND gate 210, NOR gate 212 and output driver stage 214. Output driver stage 214 includes p-channel pull-up transistor P10 and n-channel pull-down transistor N10. When enable signal EN on enable input terminal 204 is at a logic high level, data input signal A on data input terminal 202 drives output driver transistors P10 and N10 through NAND gate 210 and NOR gate 212, respectively, such that output signal Z on output terminal 206 follows input signal A. When enable signal EN is at a logic low level, the enable signal dominates NAND gate 210 and NOR gate 212, pulling the gate of pull-up transistor P10 high and the gate of pull-down transistor N10 low causing each device to turn off. With transistors P10 and N10 off, output terminal 206 is in a high impedance state.

Figure 5:
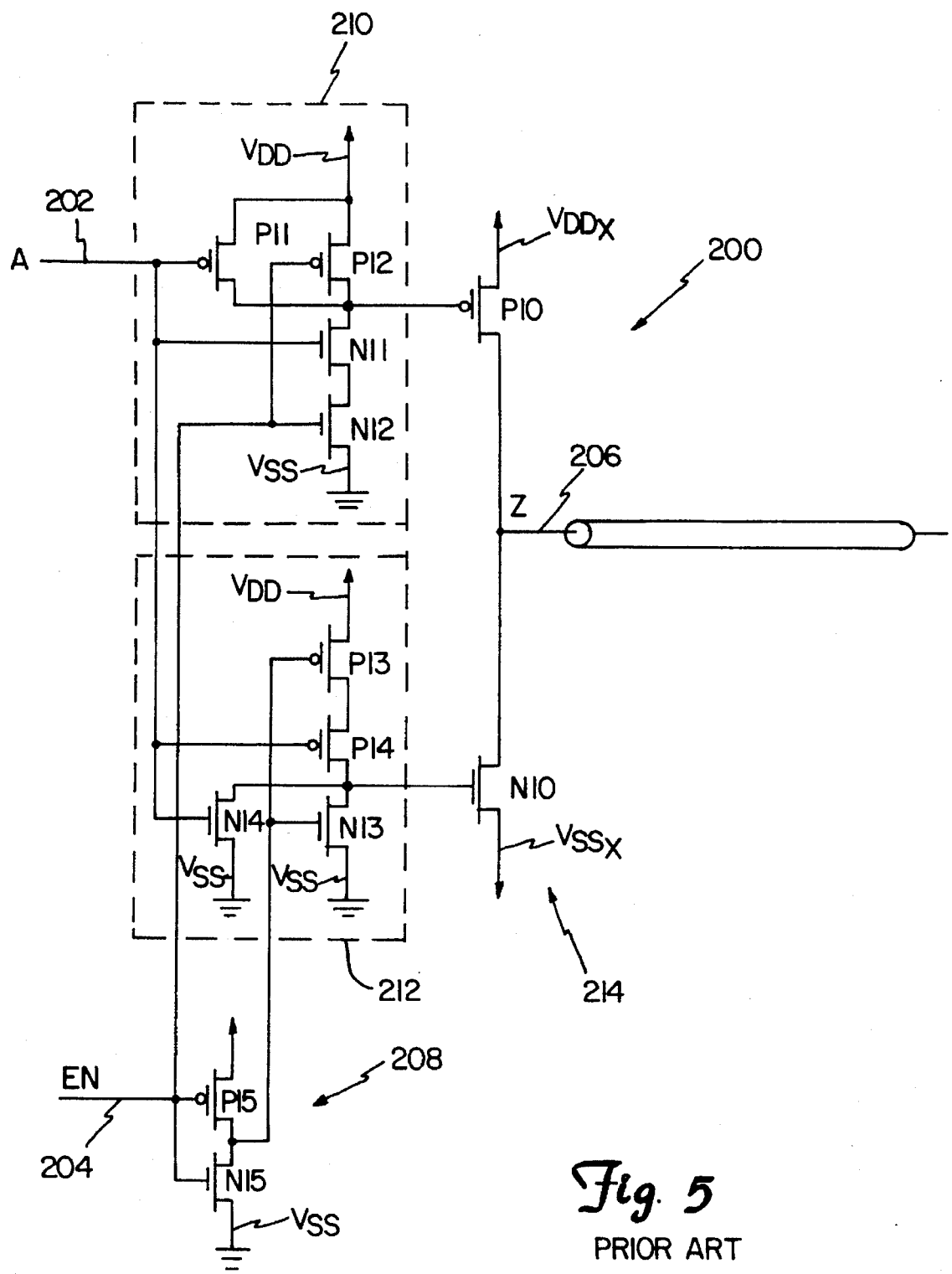
FIG. 5 is a more detailed schematic diagram of the buffer shown in FIG. 4.

FIG. 5 is a schematic diagram illustrating tri-state output buffer 200 in more detail. NAND gate 210 comprises p-channel transistors P11 and P12 and n-channel transistors N11 and N12 which are connected together to form a logic NAND function. NOR gate 212 includes p-channel transistors P13 and P14 and n-channel transistors N13 and N14 which are connected together to perform a logic NOR function. Inverter 208 includes p-channel transistor P15 and n-channel transistor N15 which are connected together to perform a logic inversion function.

Tri-state output buffer 200 requires four transistor loads on data input terminal 202, including transistors P11, N11, P14 and N14. As shown in FIG. 2, the tri-state output buffer of the present invention requires only two transistor loads on data input terminal 42, which include transistors P1 and N1. As a result, the tri-state output buffer of the present invention has improved input load performance as compared to the traditional tri-state output buffer.

In addition, the tri-state output buffer shown in FIG. 5 requires twelve transistor devices as compared the ten transistor devices required by the tri-state output buffer of the present invention. The buffer of the present invention can therefore achieve higher performance (i.e. less propagation delay) with equal area since the widths of the predriver transistors can be increased, or can occupy a smaller area with the same performance as compared to the traditional tri-state output buffer, whichever is desired.

The tri-state output buffers shown in FIGS. 2 and 5 were simulated with an HSPICE-SC simulation program. Both buffers were simulated with a 50-ohm output driver, an equal buffer area based on total device width, a transistor input switch point of about 0.4 volts, and with individual transistors sized for a symmetric buffer output delay. The results of the simulation showed that the buffer of the present invention offers improvements over a traditional buffer in several areas. Propagation delays through the buffer of the present invention were about seven percent less than the propagation delays through the traditional buffer. Total power consumption of the buffer is only slightly reduced, typically 1.5–3.9 percent because total power consumption is primarily a function of the external load. Current spikes generated at the buffer output were reduced by a factor of five to seven times.

Also, the sizes of the transmission gate transistors of the present invention can easily be adjusted to adjust slew-rate performance without adversely affecting the symmetry of the output delays. While the same slew-rate effect can be achieved by resizing the transistors in the NAND and NOR gates of the traditional buffer, it is more difficult to do since NAND and NOR gates have different drive characteristics which introduce different rise and fall characteristics of the output signal with changes in the transistor sizes. The tri-state output buffer of the present invention is not limited by this design tradeoff.

Although the present invention has been described with reference to preferred embodiments, workers skilled in the art will recognize that changes may be made in form and detail without departing from the spirit and scope of the invention. For example, the tri-state output buffer of the present invention can be implemented with various technologies, such as CMOS and BiCMOS. Other technologies may also be used. Various circuit configurations can be used to implement the tri-state output buffer of the present invention. Also, the voltage supply rails can be relatively positive or relatively negative, depending upon the particular convention adopted and the technology used. The terms "pull-up" and "pull-down" used in the specification and in the claims are arbitrary terms and can refer to either a logic high level or a logic low level depending on the convention adopted and the relative states of the power supplies. Likewise, the term "coupled" can include various types of connections or couplings and can include a direct connection or a connection through one or more intermediate components.

What is claimed is:

1. A CMOS tri-state output buffer comprising:

first and second relatively positive supply terminals which are isolated from one another;

first and second relatively negative supply terminals which are isolated from one another;

a data input terminal;

a data output terminal;

a predriver stage having a first pull-up transistor and a first pull-down transistor which are coupled between the first relatively positive and negative supply terminals, the first pull-up and pull-down transistors having control terminals coupled to the data input terminal and having first and second outputs, respectively;

an output stage having a second pull-up transistor and a second pull-down transistor which are coupled between the second relatively positive and negative supply terminals, the second pull-up and pull-down transistors having control terminals coupled to the first and second outputs, respectively, and having third and fourth output terminals coupled to the data output terminal;

an enable input terminal;

an enable control circuit coupled to the enable input and having complementary output terminals; and a CMOS transmission gate coupled between the control terminals of the second pull-up and pull-down transistors and having complementary control terminals coupled to respective ones of the complementary output terminals.

2. The CMOS tri-state output buffer of claim 1 wherein the enable control circuit comprises an inverter coupled between the enable input terminal and one of the complementary output terminals and wherein the other of the complementary output terminals is coupled to the enable input terminal.

3. The CMOS tri-state output buffer of claim 1 and further comprising:

a third pull-up transistor coupled to the control terminal of the second pull-up transistor and having a control terminal coupled to one of the complementary control terminals of the enable control circuit; and a third pull-down transistor coupled to the control terminal of the second pull-down transistor and having a control terminal coupled to the other complementary control terminal of the enable control circuit.

4. The CMOS tri-state output buffer of claim 3 wherein:

the first, second and third pull-up transistors are p-channel CMOS transistors; and the first, second and third pull-down transistors are n-channel CMOS transistors.

5. A tri-state buffer comprising:

first and second relatively positive supply terminals which are isolated from one another;

first and second relatively negative supply terminals which are isolated from one another;

a data input terminal;

a data output terminal;

an enable input terminal;

a predriver stage having a first pull-up transistor and a first pull-down transistor which have control terminals coupled to the data input terminal and have first and second outputs, respectively, wherein the first pull-up and pull-down transistors are coupled between the first relatively positive and negative supply terminals;

an output stage having a second pull-up transistor and a second pull-down transistor which have control terminals coupled to the first and second outputs, respectively, and which have third and fourth output terminals coupled to the data output terminal, wherein the second pull-up and pull-down transistors are coupled between the second relatively positive and negative supply terminals;

means coupled between the enable input terminal and the control terminals of the second pull-up and pull-down transistors for selectively placing the second pull-up and pull-down transistors in a non-conductive state as a function of an enable signal applied to the enable input terminal; and means coupled between the enable input terminal and the control terminals of the second pull-up and pull-down transistors for selectively coupling and decoupling the control terminals of the second pull-up and pull-down transistors as a function of the enable signal applied to the enable input terminal.

6. A tri-state output buffer comprising:

first and second relatively positive supply terminals which are isolated from one another;

first and second relatively negative supply terminals which are isolated from one another;

a data input terminal;

a data output terminal;

an enable input terminal;

a predriver stage having a first pull-up transistor and a first pull-down transistor which have control terminals coupled to the data input terminal and have first and second outputs, respectively, wherein the first pull-up and pull-down transistors are coupled between the first relatively positive and negative supply terminals;

an output stage having a second pull-up transistor and a second pull-down transistor which have control terminals coupled to the first and second outputs, respectively, and which have third and fourth output terminals coupled to the data output terminal, wherein the second pull-up and pull-down transistors are coupled between the second relatively positive and negative supply terminals; and third pull-up and pull-down transistors coupled to the first and second outputs, respectively, and having control terminals, wherein the control terminal of the third pull-up transistor is coupled to the enable input terminal;

an inverter coupled between the enable input terminal and the control terminal of the third pull-down transistor; and a CMOS transmission gate coupled between the first and second output terminals and having complementary control terminals, with one complementary control terminal coupled to the enable input terminal and the other complementary control terminal coupled to the inverter.

* * * * *